(12) United States Patent
Shieh et al.

(10) Patent No.: US 9,929,153 B2
(45) Date of Patent: Mar. 27, 2018

(54) METHOD OF MAKING A FINFET DEVICE

(71) Applicant: Taiwan Semiconductor Manufacturing Company, Ltd., Hsin-Chu (TW)

(72) Inventors: Ming-Feng Shieh, Yongkang (TW); Weng-Hung Tseng, Yilan County (TW); Tzung-Hua Lin, Taipe (TW); Hung-Chang Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 210 days.

(21) Appl. No.: 14/057,183

(22) Filed: Oct. 18, 2013

(65) Prior Publication Data

US 2015/0108551 A1    Apr. 23, 2015

(51) Int. Cl.
*H01L 21/8234* (2006.01)
*H01L 27/088* (2006.01)
*H01L 21/84* (2006.01)

(52) U.S. Cl.
CPC .. *H01L 27/0886* (2013.01); *H01L 21/823431* (2013.01); *H01L 21/823481* (2013.01); *H01L 21/845* (2013.01)

(58) Field of Classification Search
CPC ......... H01L 21/823431; H01L 27/0886; H01L 21/823481; H01L 21/845
See application file for complete search history.

(56) References Cited

U.S. PATENT DOCUMENTS

| | | | |
|---|---|---|---|
| 8,039,179 B2 | 10/2011 | Shieh et al. | |
| 8,202,681 B2 | 6/2012 | Lin et al. | |
| 8,728,332 B2 | 5/2014 | Lin et al. | |
| 8,822,243 B2 | 9/2014 | Yan et al. | |
| 2005/0056888 A1* | 3/2005 | Youn et al. | 257/331 |
| 2006/0091468 A1 | 5/2006 | Liaw | |
| 2011/0281208 A1 | 11/2011 | Lin et al. | |
| 2012/0091511 A1* | 4/2012 | Chen | H01L 21/3086 257/213 |
| 2012/0244711 A1* | 9/2012 | Yin et al. | 438/703 |
| 2012/0278776 A1 | 11/2012 | Lei et al. | |
| 2013/0277720 A1* | 10/2013 | Kim | H01L 29/785 257/288 |
| 2013/0295769 A1 | 11/2013 | Lin et al. | |
| 2013/0320451 A1 | 12/2013 | Liu et al. | |
| 2014/0193974 A1 | 7/2014 | Lee et al. | |
| 2014/0215421 A1 | 7/2014 | Chen et al. | |

(Continued)

*Primary Examiner* — Amar Movva
(74) *Attorney, Agent, or Firm* — Haynes and Boone, LLP

(57) ABSTRACT

A method of fabricating a fin-like field-effect transistor (FinFET) device is disclosed. The method includes forming a mandrel features over a substrate, the mandrel feature and performing a coarse cut to remove one or more mandrel features to form a coarse space. After the coarse cut, the substrate is etched by using the mandrel features, with the coarse space as an etch mask, to form fins. A spacer layer is deposited to fully fill in a space between adjacent fins and cover sidewalls of the fins adjacent to the coarse space. The spacer layer is etched to form sidewall spacers on the fins adjacent to the coarse space. A fine cut is performed to remove a portion of one or more mandrel features to form an end-to-end space. An isolation trench is formed in the end-to-end space and the coarse space.

20 Claims, 11 Drawing Sheets

(56) References Cited

U.S. PATENT DOCUMENTS

| | | |
|---|---|---|
| 2014/0242794 A1 | 8/2014 | Lin et al. |
| 2014/0264760 A1 | 9/2014 | Chang et al. |
| 2014/0264899 A1 | 9/2014 | Chang et al. |
| 2014/0273442 A1 | 9/2014 | Liu et al. |
| 2014/0273446 A1 | 9/2014 | Huang et al. |

* cited by examiner

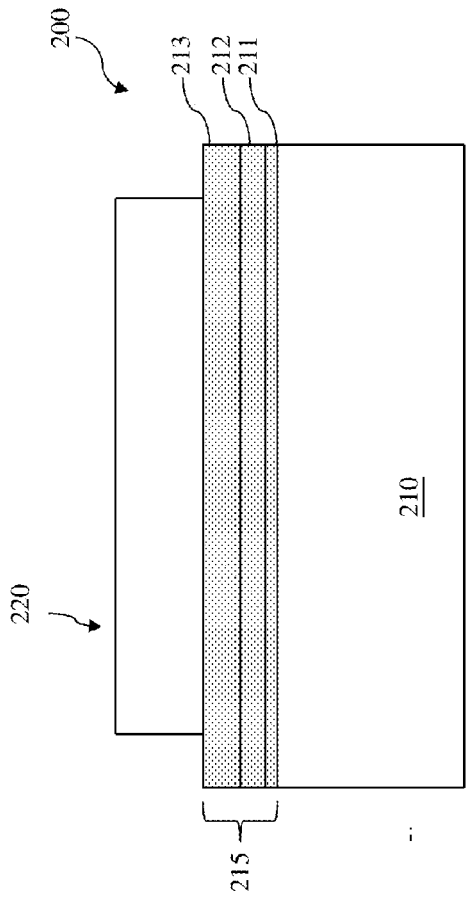
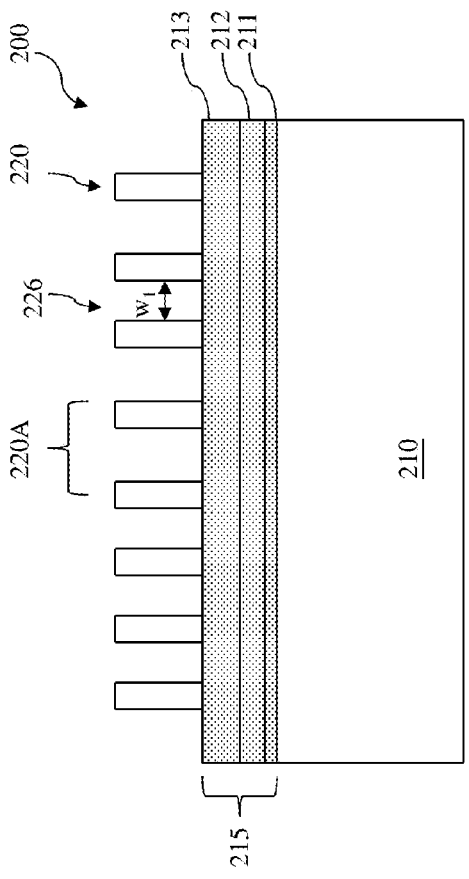
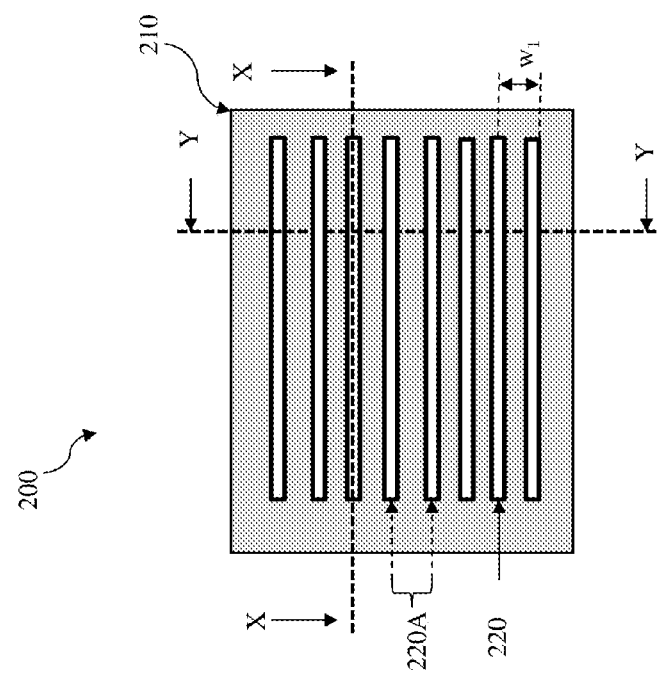
FIG. 2B
FIG. 2C
FIG. 2A

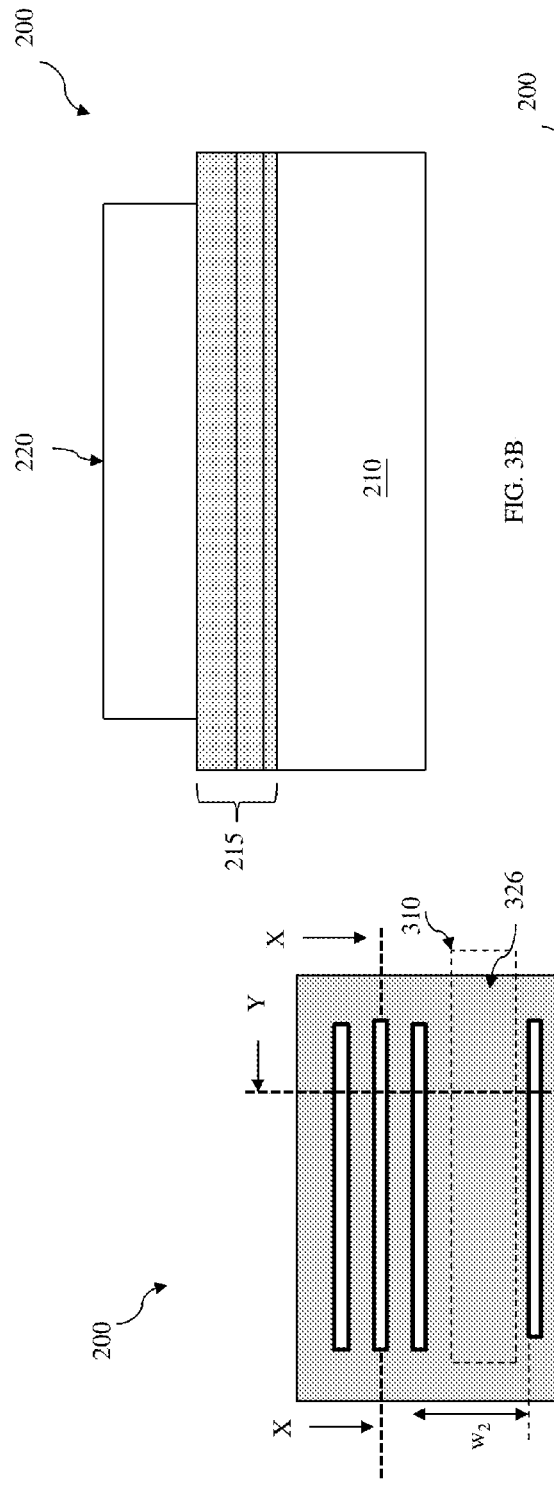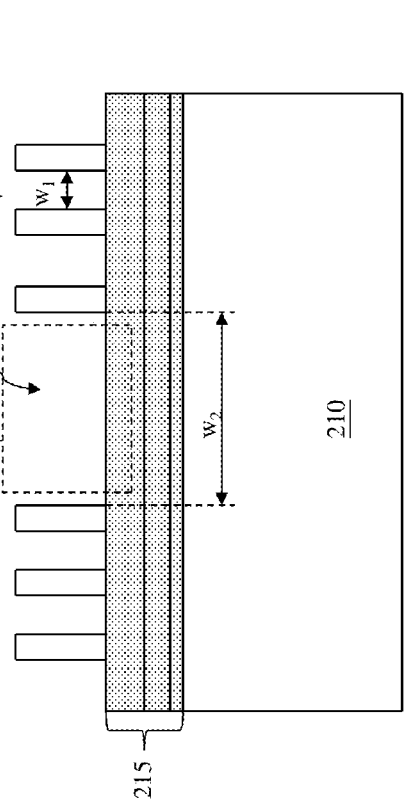
FIG. 3A
FIG. 3B
FIG. 3C

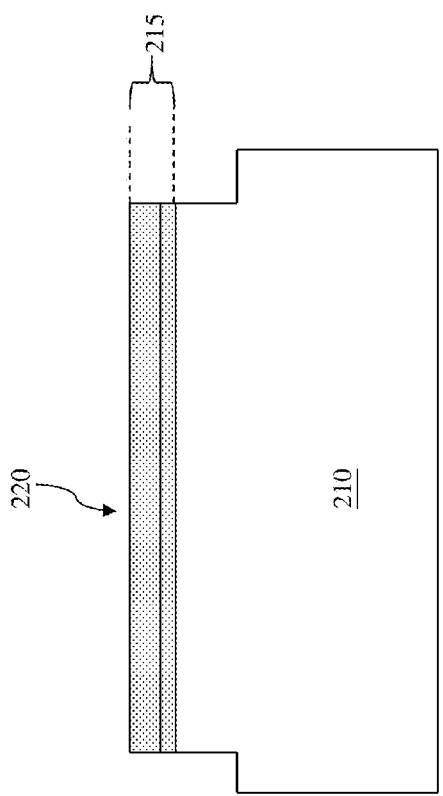
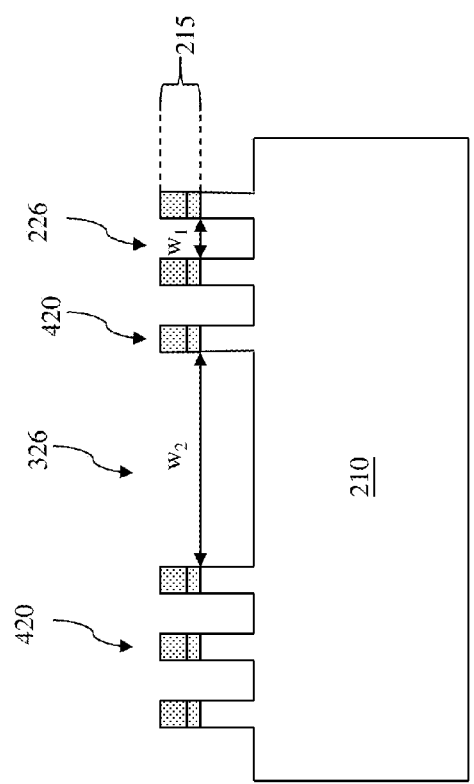

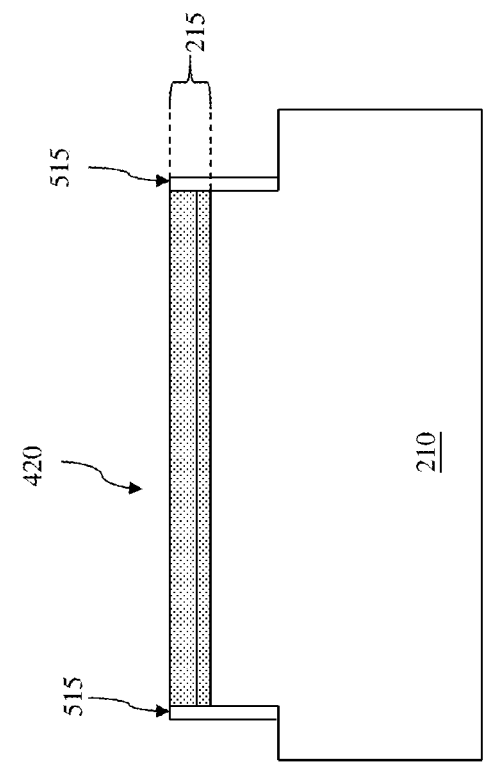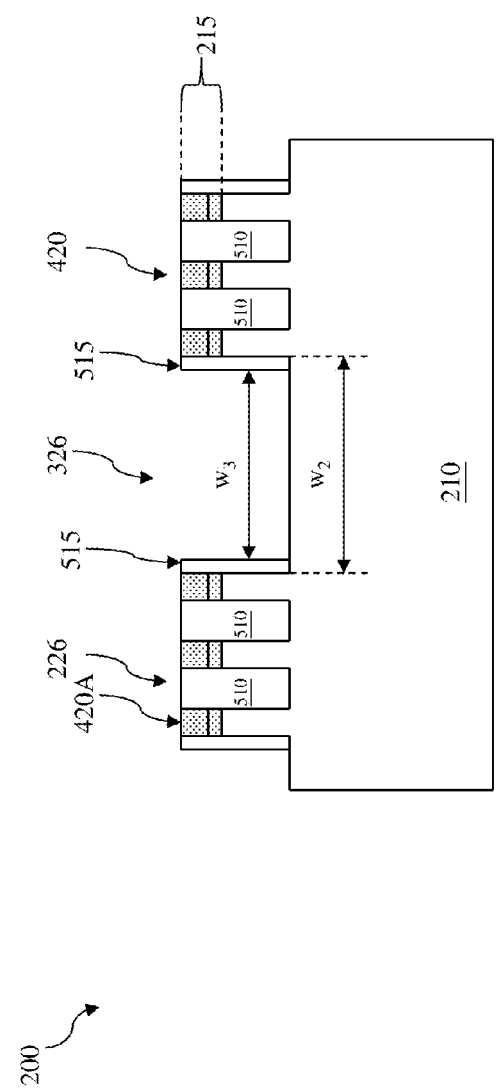

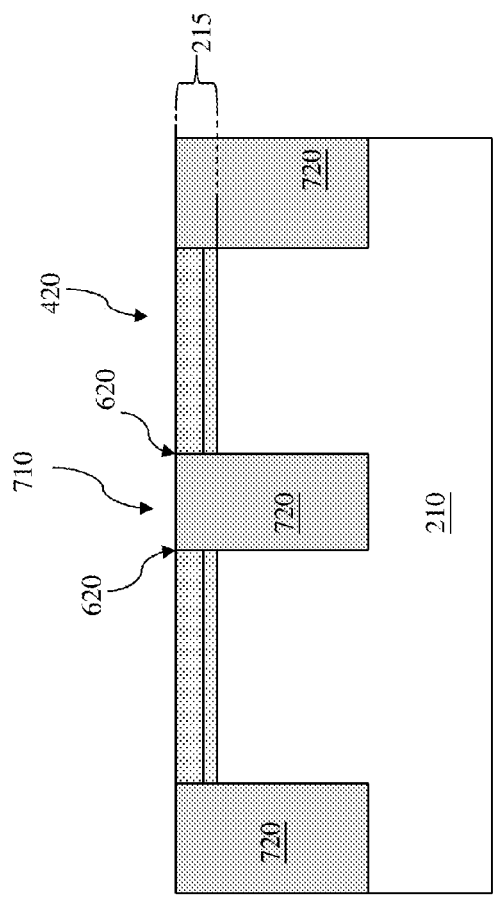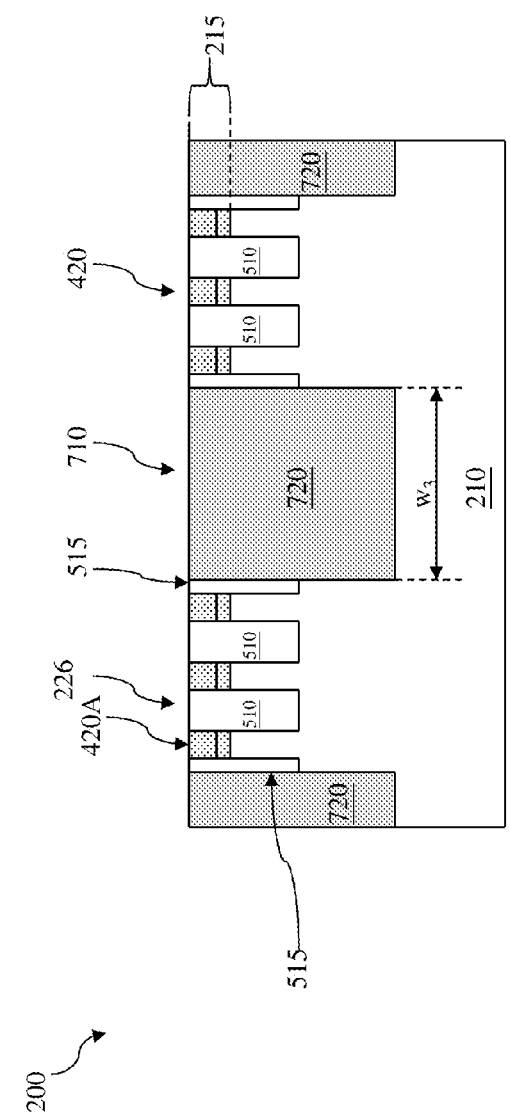

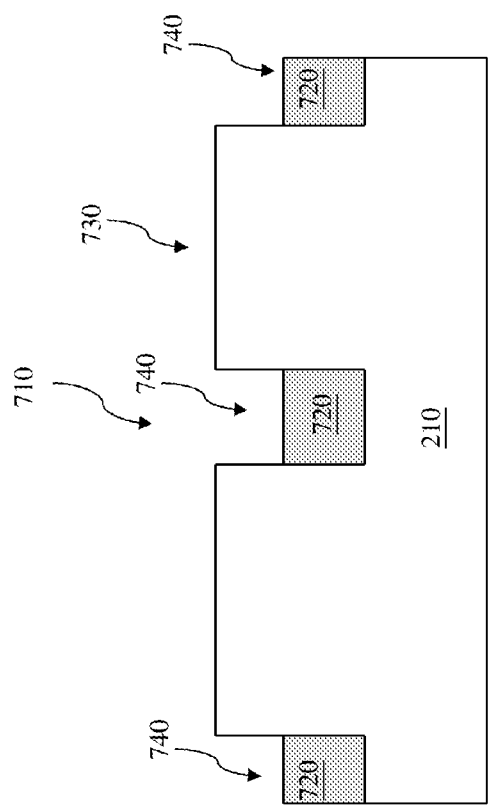
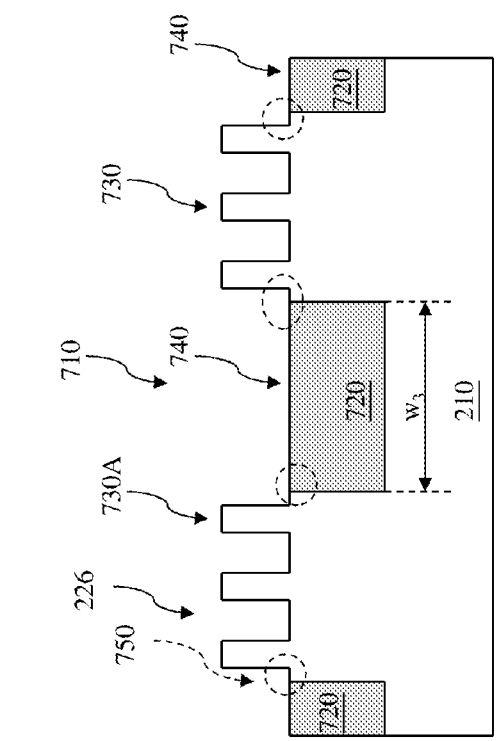

METHOD OF MAKING A FINFET DEVICE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-like field-effect transistor (FinFET), has been introduced to replace a planar transistor. Although existing FinFET devices and methods of fabricating FinFET devices have been generally adequate for their intended purposes, they have not been entirely satisfactory in all respects. For example, a more flexible integration for forming fin and isolation structures is desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 2A is a diagrammatic top view of a FinFET device at fabrication stages constructed according to the method of FIG. 1

FIG. 2B is a cross-sectional view of an example FinFET device along line X-X in FIG. 2A at fabrication stages constructed according to the method of FIG. 1.

FIG. 2C is a cross-sectional view of an example FinFET device along line Y-Y in FIG. 2A at fabrication stages constructed according to the method of FIG. 1.

FIG. 3A is a diagrammatic top view of a FinFET device at fabrication stages constructed according to the method of FIG. 1

FIG. 3B is a cross-sectional view of an example FinFET device along line X-X in FIG. 3A at fabrication stages constructed according to the method of FIG. 1.

FIG. 3C is a cross-sectional view of an example FinFET device along line Y-Y in FIG. 3A at fabrication stages constructed according to the method of FIG. 1.

FIGS. 4A, 5A and 6A are cross-sectional views of an example FinFET device along line X-X in FIG. 3A at fabrication stages constructed according to the method of FIG. 1.

FIGS. 4B, 5B and 6B are cross-sectional views of an example FinFET device along line Y-Y in FIG. 3A at fabrication stages constructed according to the method of FIG. 1

FIGS. 8A, 9A and 10A are cross-sectional views of an example FinFET device along line X-X in FIG. 7A at fabrication stages constructed according to the method of FIG. 1.

FIGS. 8B, 9B and 10B are cross-sectional views of an example FinFET device along line Y-Y in FIG. 7A at fabrication stages constructed according to the method of FIG. 1.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

The present disclosure is directed to, but not otherwise limited to, a FinFET device. The FinFET device, for example, may be a complementary metal-oxide-semiconductor (CMOS) device comprising a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

Figure 1:
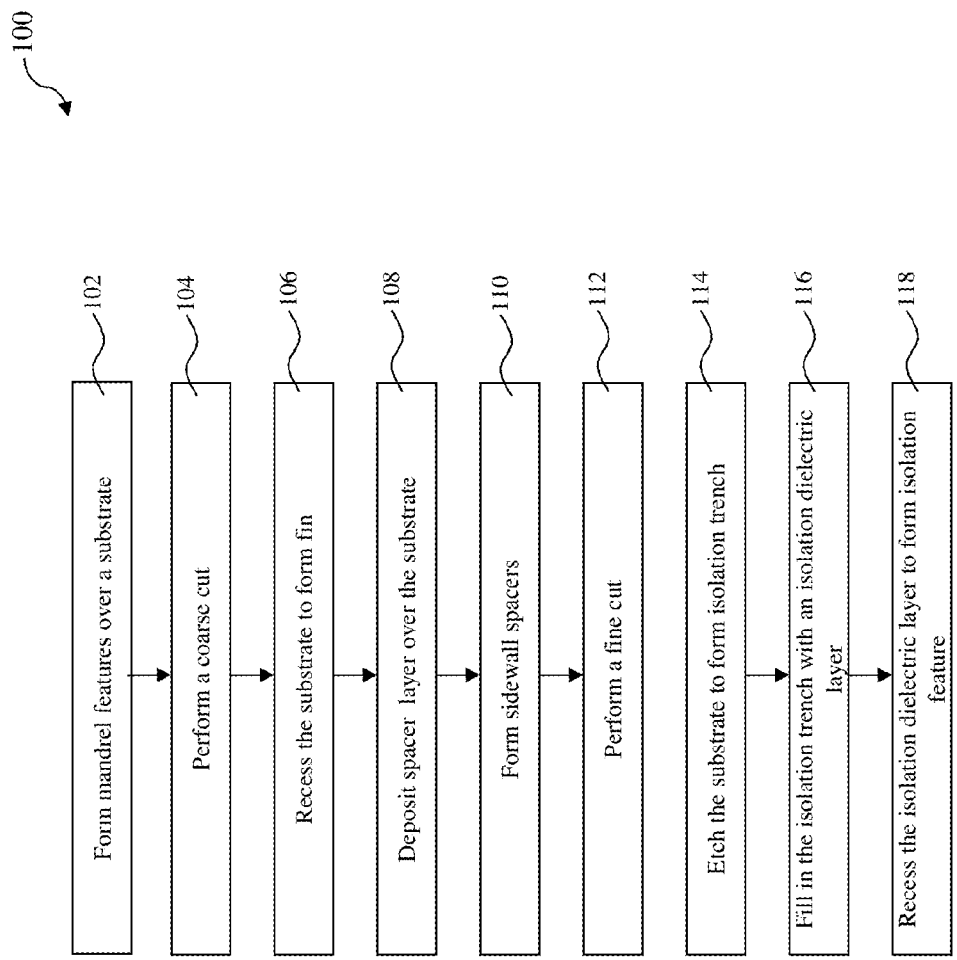
FIG. 1 is a flow chart of an example method for fabricating a semiconductor device according to various aspects of the present disclosure.

FIG. 1 is a flowchart of a method 100 for fabricating a FinFET device according to aspects of the present disclosure. It is understood that additional steps can be provided before, during, and after the method, and some of the steps described can be replaced or eliminated for other embodiments of the method. The method 100 is discussed in detail below, with reference to a FinFET device 200 shown in FIGS. 2A to 10B for the sake of example. The present disclosure repeats reference numerals and/or letters in the various embodiments. This repetition is for the purpose of simplicity and clarity and does not in itself dictate a relationship between the various embodiments and/or configurations discussed.

Referring to FIGS. 1 and 2A-2C, the method 100 begins at step 102 by forming a plurality of mandrel features 220 on a substrate 210. Although the mandrel features 220 are illustrated as rectangular-shaped lines, such is not required. Each mandrel feature 220 is a dummy feature and will be removed at a later fabrication stage. For the sake of later reference, a group of the mandrel features 220 will be designated with the reference number 220A.

The substrate 210 includes a semiconductor substrate, such as a silicon wafer. Alternatively, the substrate 210 includes germanium, silicon germanium or other proper semiconductor materials. In one embodiment, the substrate 210 includes an epitaxy (or epi) semiconductor layer. In another embodiment, the substrate 210 includes a buried dielectric material layer for isolation formed by a proper technology, such as a technology referred to as separation by implanted oxygen (SIMOX). In some embodiments, the substrate 210 may be a semiconductor on insulator, such as silicon on insulator (SOI).

The substrate 210 may include various doped regions depending on design requirements as known in the art. The doped regions may be doped with p-type dopants, such as boron or BF2; n-type dopants, such as phosphorus or arsenic; or combinations thereof. The doped regions may be formed directly on the substrate 210, in a P-well structure, in an N-well structure, in a dual-well structure, or using a raised structure. The substrate 210 may further include various active regions, such as regions configured for an N-type metal-oxide-semiconductor transistor device and regions configured for a P-type metal-oxide-semiconductor transistor device.

In one embodiment, prior to forming the mandrel features 220, a hard mask 215 is formed over the substrate 210 to provide protection to a fin structure in subsequent processes. The hard mask 215 may include multiple layers to gain process flexibility. For example, the hard mask 215 includes a first oxide layer 211 deposited over the substrate 210, a silicon nitride layer 212 deposited over the first oxide layer 211 and a second silicon oxide layer 213 deposited over the silicon nitride layer 212. One or more of the layers 211, 212 and 213 may be formed by various methods, including thermal oxidation, a chemical vapor deposition (CVD) process, plasma enhanced CVD (PECVD), atomic layer deposition (ALD), and/or other methods known in the art.

The mandrel features 220 are then formed over the hard mask 215. In one embodiment, the mandrel features 220 are formed by depositing a mandrel material layer, such as a dielectric material (silicon oxide, silicon nitride for examples); forming a resist pattern; and etching the mandrel material layer using the resist layer as an etch mask, thereby forming the mandrel features 220. In another embodiment, the mandrel features 220 are resist patterns. In one embodiment, the mandrel features 220 are a plurality of parallel mandrel lines along a first direction of X-X and a first space 226 between adjacent mandrel lines 220 is a first width $w_1$.

Referring to FIGS. 1 and 3A-3C, the method 100 proceeds to step 104 by performing a first cut in a first region 310 to remove a subset of the mandrel features 220, such as the group 220B, to form a coarse space 326. In some cases, the coarse space 326 has a second width $w_2$ which is substantially larger than the first width $w_1$. Therefor the first cut is referred as a coarse cut. In one embodiment, the coarse cut is performed by forming a coarse cut pattern having a coarse opening such that the group 220B is uncovered. Then the coarse cut pattern is used as an etch mask during a subsequent etch process to remove the group 220B.

Referring to FIGS. 1 and 4A-4B, the method 100 proceeds to step 106 by recessing the substrate 210 to form a plurality of fins 420 by using the mandrel features 220 as an etch mask. In one embodiment, the substrate 210 is etched by a selective etch. The etch process selectively removes the substrate 210, as well as the hard mask 215, but substantially does not etch the mandrel features 220. The etch process may include a dry etching, a wet etching, and/or a combination thereof. A wet etching process can use solutions such as tetramethylammonium hydroxide (TMAH), a HF/HNO3/CH3COOH solution, NH$_4$OH, KOH (potassium hydroxide), HF (hydrofluoric acid), or other suitable solution. A dry etching process can include a plasma etching process that uses a chlorine-based chemistry. Other dry etchant gasses include CF$_4$, NF$_3$, SF$_6$, and He. Dry etching may include transformer coupled plasma (TCP) etch, electron cyclotron resonance (ECR) etch and reactive ion etch (RIE).

In the present embodiment, the fins 420s are formed to carry the first space 226 (having the first width $w_1$) and the coarse space 326 (having the second width $w_2$) and have the hard mask 215 as its top layer.

Thereafter, the mandrel features 220 are removed by a suitable process. In one example where the mandrel features 220 are resist patterns, they are removed by wet stripping or plasma ashing. In another example, the mandrel features 220 are made of a dielectric material and may be removed by a wet etching process to selectively remove the mandrel material. In one embodiment, one or more layers of the hard mask 215, such as the second oxide layer 213, is also removed.

Figure 5A:
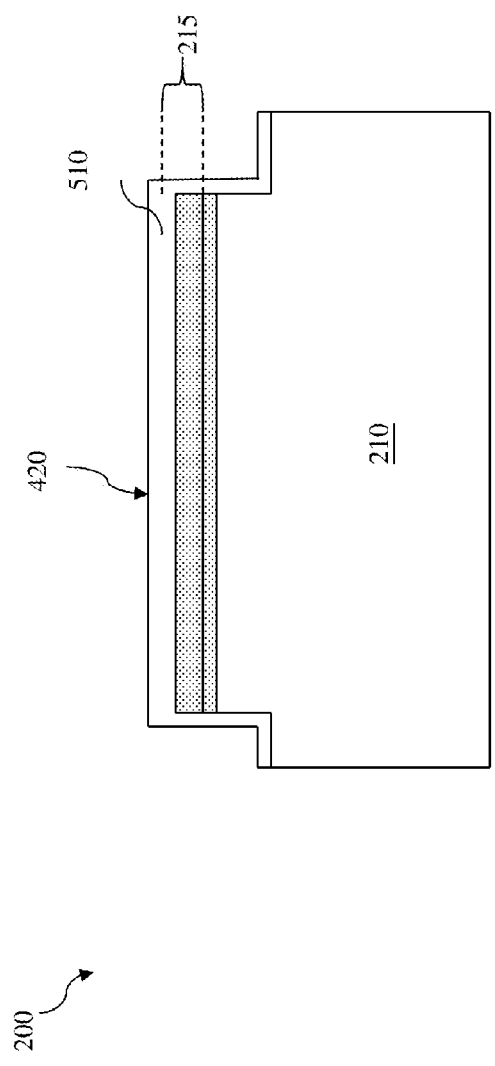
Figure 5B:
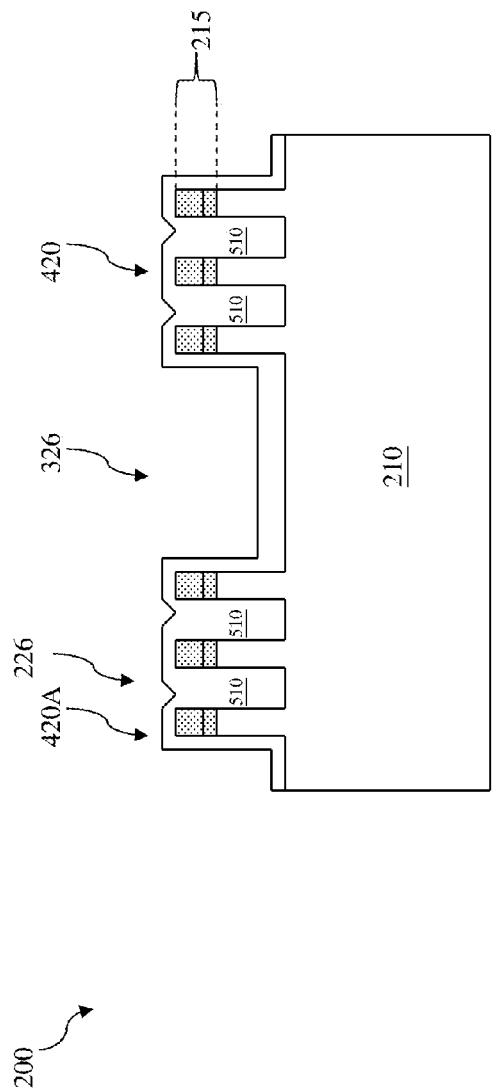
Figure 7A:
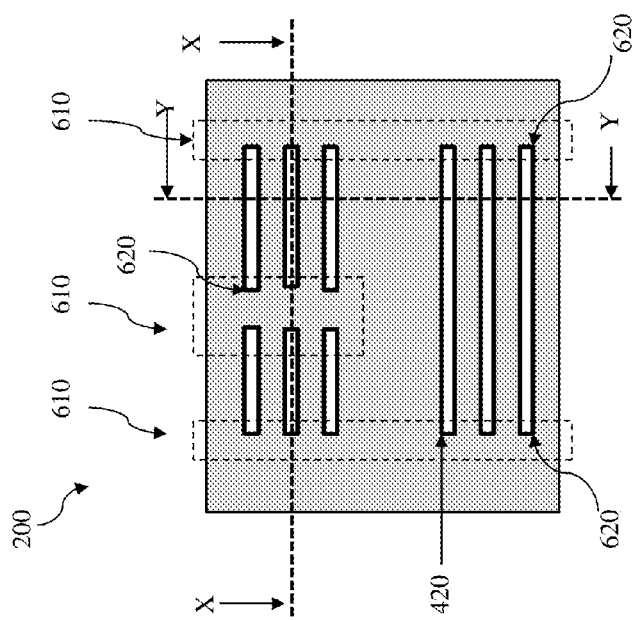
FIG. 7A-7C are a diagrammatic top view of a FinFET device at fabrication stages constructed according to the method of FIG. 1
Figure 7B:
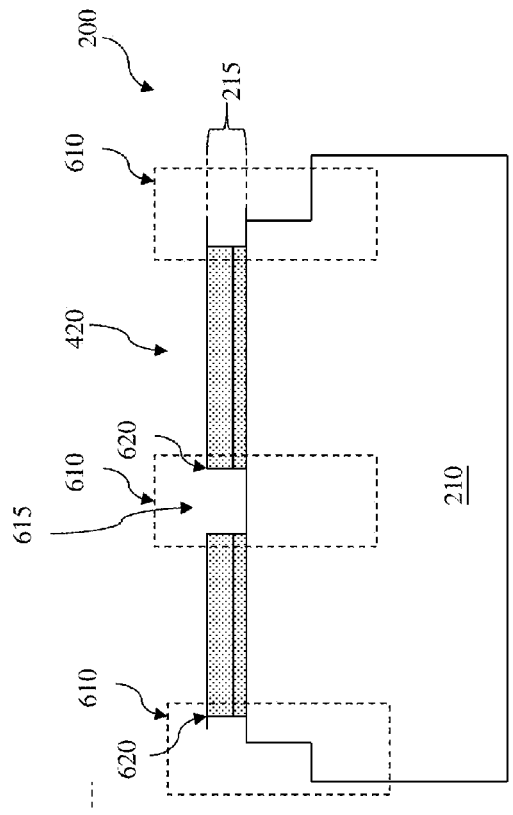
Figure 7C:
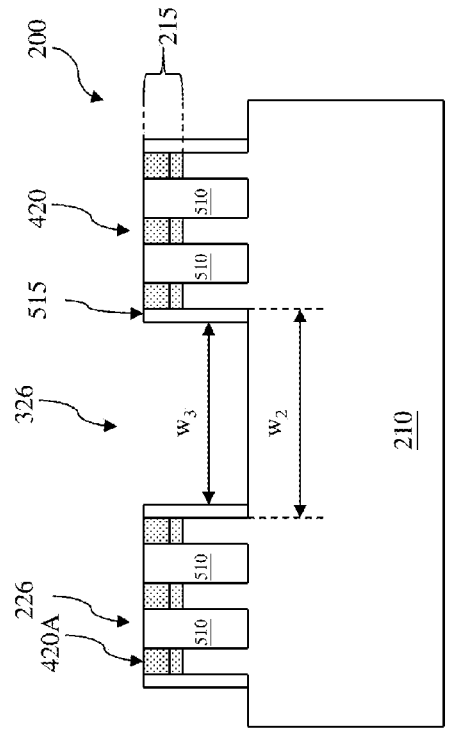

Referring to FIGS. 1 and 5A-5B, the method 100 proceeds to step 108 by depositing a spacer layer 510 over the substrate 210. In the present embodiment, the spacer layer 510 is configured such that it fully fills in the first space 226 and partially fills in the coarse space 326. The spacer layer 510 also covers sidewalls of the fins 420 adjacent to the coarse space 326. For the sake of clarity and simplicity, the fins 420 adjacent to the coarse space 326 are assigned reference numbers 420A. The spacer layer 510 includes silicon oxide, silicon nitride, silicon oxynitride, or other suitable materials, or combinations thereof. The spacer layer 510 may be deposited by CVD, ALD, or any other suitable techniques.

Referring to FIGS. 1 and 6A-6B, the method 100 proceeds to step 110 by etching the spacer layer 510 to form spacers 515 on sidewalls of the fins 420A. In the present embodiment, the spacer etch process is controlled such that it removes the spacer layer 510 on top of the hard mask 215 in the fins 420, removes the spacer layer 510 at the bottom of the coarse space 326 to expose the substrate 210, yet remains in the first space 226. The etch process may include any suitable process, such as an anisotropic plasma etch. With the spacers 515, a third width $w_3$ is smaller than the second width $w_2$.

Referring to FIGS. 1 and 7A-7C, the method 100 proceeds to step 112 by performing a second cut to removing a portion of one or more the mandrel features 220 in a second region 610 to form an end-to-end space 615 and line-ends 620. As example, a portion of one or more mandrel features 220 within the second region 610 is removed for form the end-to-end space 615 and the line-ends 620. In the present embodiment, after the second cut, the substrate 210 in the end-to-end space 615 is exposed. In some cases, the end-to-end space 615 is substantially smaller than the coarse space 326 (but is larger than the first space 226). Therefore, the second cut is referred to as a fine cut and the first cut as a coarse cut. In one embodiment, the line-end 620 aligns in a second direction Y-Y perpendicular to the first direction X-X. In one embodiment, the fine cut is performed by forming a second cut pattern having second openings in the second region 610 such that a portion of the mandrel features 220 within the second openings are uncovered. Then the second cut pattern is used as an etch mask during a subsequent etch process to remove the portion of mandrel features 220 in the second openings. The etch process may be implemented by any suitable techniques, such as a wet etch, a dry etch, or a combination thereof. After the second cut, the second cut pattern is removed. By using the cut technique, the line-end 620 may be formed with substantially vertical profile and it may reduce issues of line-end shortening and corner rounding dramatically.

Figure 8A:
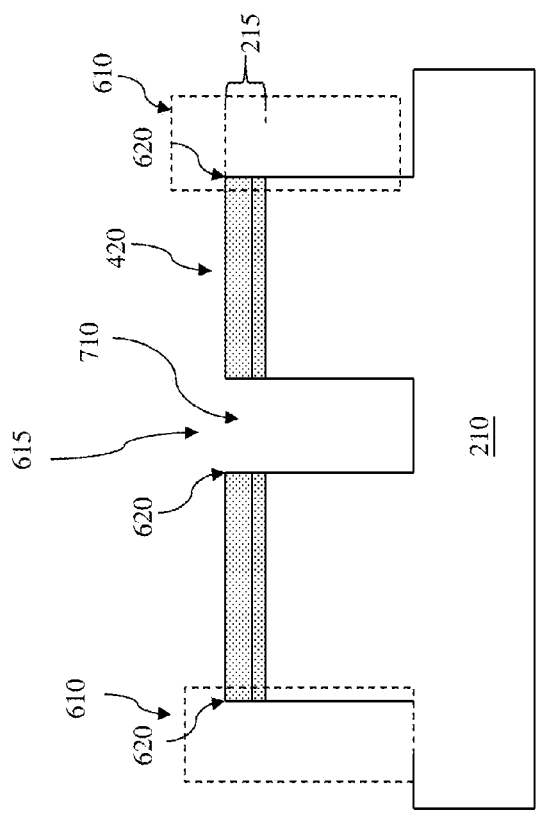
Figure 8B:
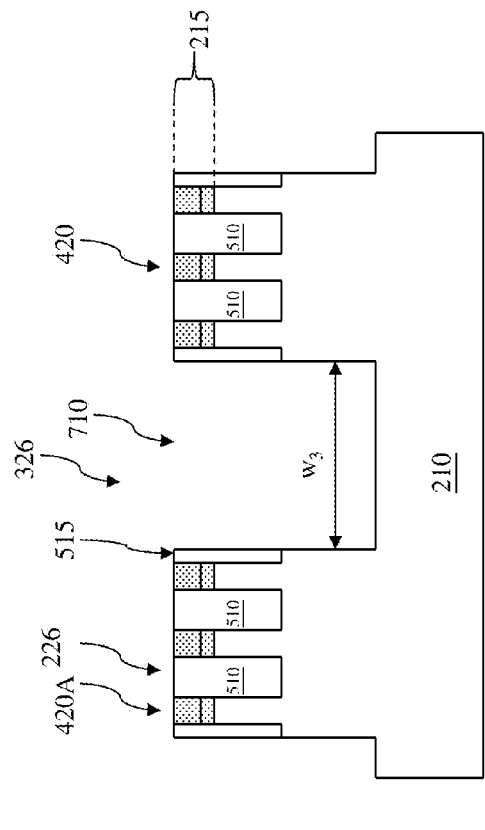

Referring to FIGS. 1 and 8A-8B, the method 100 proceeds to step 114 by performing a trench etch to etch the exposed portion of the substrate 210 in the coarse space 326 and the end-to-end space 615 to form isolation trenches 710. The etch process may include a selective wet etch or a selective dry etch. A wet etching solution includes a tetramethylammonium hydroxide (TMAH), a HF/HNO$_3$/CH$_3$COOH solution, or other suitable solution. Dry etching processes include a biased plasma etching process that uses a chlorine-based chemistry. Other dry etchant gasses include CF$_4$, NF$_3$, SF$_6$, and He. The etch process may include multiple etch steps to optimize the etch effect.

Protected by a combination of the hard mask 215, the spacer layer 510 filled in the first space 216, and the spacer 515, the fins 420 remain intact along the X-X direction during the trench etch. The impact of the trench etching on uniformity of the size of the fins 420 and the first space 226 is minimized, especially for those close to the coarse space 326. Also, constraints of the trench etch process can be relaxed. The trench etch may align with the spacer 515, thus the isolation trench 710 may be formed with self-alignment nature, which can benefit etch process window improvement. The isolation trench 710 in the coarse space 326 is formed with a same width as the third width $w_3$.

Referring to FIGS. 1 and 9A-9B, the method 100 proceeds to step 116 by filling in the isolation trench 710 with an isolation dielectric layer 720. The isolation dielectric layer 720 includes silicon oxide, silicon nitride, silicon oxynitride, or other suitable materials, or combinations thereof. In some examples, the isolation dielectric layer 720 has a multi-layer structure. The isolation dielectric layer 720 may be deposited by CVD, ALD, or any other suitable techniques. A chemical mechanical polishing (CMP) process may be performed subsequently to remove excess isolation dielectric layer 720 to expose the hard mask 215 in the fins 420 and also provide a substantially planar surface.

Referring to FIGS. 1 and 10A-10B, the method 100 proceeds to step 118 by removing the hard mask 215 and the spacer layer 510 in the first space 226 to reveal the fins, now labeled with the reference number 730 and 730A, respectively, and recessing the isolation dielectric layer 720 to form an isolation feature 740 in the isolation trench 710. The isolation feature 740 provides electrical isolation between active regions. The etch processes includes a selective wet etch or a selective dry etch, or a combination thereof. In one embodiment, the hard mask 215 and the spacer layer 510 is removed first and then the isolation dielectric layer 720 is recessed. In another embodiment, the hard mask 215, the spacer layer 510 and the isolation dielectric layer 720 are etched same time. After the spacers 515 are removed, a shoulder-shape structure 750 is left in the substrate 210 at feet of the fins 730A, where the spacer 515 existed previously. Each of the shoulder-shape structure 750 has a substantial same width.

Additional steps can be provided before, during, and after the method 100, and some of the steps described can be replaced or eliminated for other embodiments of the method.

Figure 11B:
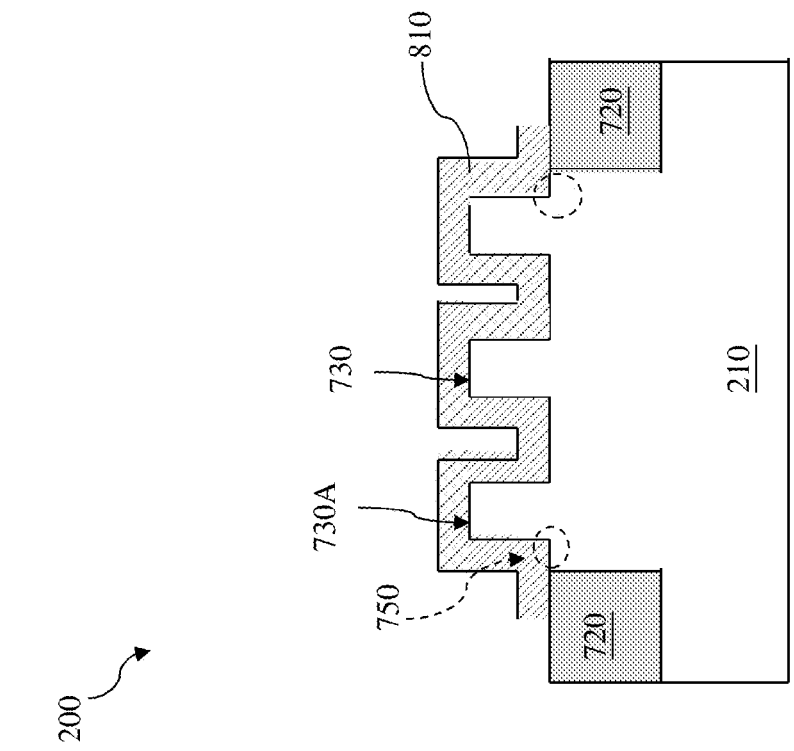
FIG. 11B is a cross-sectional view of an example FinFET device along line Y-Y in FIG. 11A.
Figure 11A:
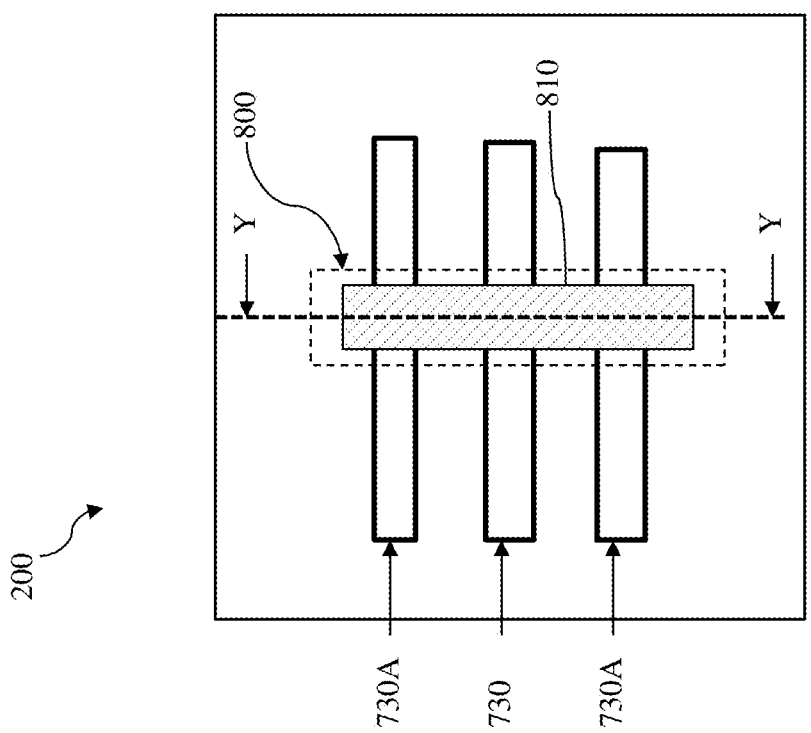
FIG. 11A is a diagrammatic top view of a FinFET device at fabrication stages.

The FinFET device 200 undergoes further CMOS or MOS technology processing to form various features and regions. For example, the FinFET device 200 may include a high-k (HK)/metal gate (MG) 810 over the substrate 210, including wrapping over a portion of the fins 730 (including the fins 730A) in a gate region 800, where the fins 730 (including the fins 730A) may serve as gate channel region, as shown in FIGS. 11A and 11B. In the present embodiment, in the gate region 800, the shoulder-shape structures 750 remain in the substrate 210 at feet of the fins 730A, which are the fins at an edge of a group of fins 730. Each of shoulder-shape structures 750 has a substantial same width to each other.

The FinFET device 200 may also include an interlayer dielectric (ILD) layer formed between the HK/MG over the substrate 210. The ILD layer includes silicon oxide, oxynitride or other suitable materials. The ILD layer includes a single layer or multiple layers.

The FinFET device 200 may also include a source/drain feature in a source/drain regions in the substrate 210, including in another portion of the fins 730. As an example, a portion of the fins 730 in the source/drain regions is recessed first. Then, a semiconductor material epitaxially grows in the recessed portion of the fins 730 to form the source/drain feature. The semiconductor material includes Ge, Si, GaAs, AlGaAs, SiGe, GaAsP, or other suitable material.

The FinFET device 200 may also includes various contacts/vias/lines and multilayers interconnect features (e.g., metal layers and interlayer dielectrics) over the substrate 210. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Based on the above, the present disclosure offers a method for fabricating a FinFET device. The method employs a scheme of forming fin first, with a coarse cut, and isolation trench last. The method employs protecting the fin during the formation of the isolation trench. The method provides an isolation trench formation with a self-alignment nature and reduced width. The method demonstrates improvements of process window and uniformity of size of the fin and a space between fins.

The present disclosure provides many different embodiments of fabricating a fin-like field-effect transistor (FinFET) device that provide one or more improvements over existing approaches. In one embodiment, a method for fabricating a FinFET device includes receiving a substrate, forming a mandrel features over the substrate. The method also includes performing a coarse cut to remove one of more mandrel features to form a coarse space. The method also includes after the coarse cut, etching the substrate by using the mandrel features, with the coarse space, as an etch mask to form fins. The method also includes depositing a spacer layer to fully fill in a space between adjacent fins and cover sidewalls of the fins adjacent to in the coarse space, etching the spacer layer to form sidewall spacers on the fins adjacent the coarse space. The method also includes after forming sidewall spacers, performing a fine cut to remove a portion of one or more mandrel features to form an end-to-end space and a line-end; and forming an isolation trench in the end-to-end space and the coarse space with sidewall spacers covering the fins and the spacer layer filling in the space between the adjacent fins.

In another embodiment, a FinFET device includes a substrate having a gate region, a group of fin features formed in the gate region. Fin features at edges of the group have shoulder-shape structures in the substrate at each outside foot of fin features. Each of the shoulder-shape structures has a substantial same width to each other. The FinFET device also includes a gate layer wrapping over the fin features in the gate region.

In yet another embodiment, a method for fabricating a FinFET device includes providing a substrate, forming a plurality of fins over the substrate, forming a coarse space among the fins, depositing a spacer layer to fill in a space between adjacent fins and cover sidewalls of the fins, forming sidewall spacers on the fins, forming an end-to-end space among the fins, forming an isolation trench in the end-to-end space and the coarse space. Thus the fins are protected by the spacer layer and spacer. The method also includes forming an isolation feature in the isolation trench by depositing an isolation dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a fin-like field-effect transistor (FinFET) device, the method comprising:
   receiving a substrate;
   forming a plurality of mandrel features over the substrate;
   performing a coarse cut to remove one or more mandrel features to form a coarse space;
   after the coarse cut, etching the substrate by using the mandrel features as an etch mask to form fins;
   depositing a spacer layer to fully fill in a space between adjacent fins and cover sidewalls of the fins adjacent the coarse space;
   etching the spacer layer to form sidewall spacers on the fins adjacent the coarse space;
   after forming the sidewall spacers, performing a fine cut to remove a portion of one or more of the fins to form an end-to-end space and a line-end, wherein the end-to-end space is space between two ends of remaining portions of the one or more of the fins along a length direction of the fins from a plan view; and
   forming an isolation trench in the end-to-end space and the coarse space with sidewall spacers covering the fins and the spacer layer filling in the space between the adjacent fins.

2. The method of claim 1, wherein during depositing the spacer layer, the coarse space is partially filled and the space between the adjacent fins is fully filled.

3. The method of claim 1, wherein the etching the spacer layer is controlled to remove the spacer layer in the coarse space and leave the space between the adjacent fins substantially filled with the spacer layer.

4. The method of claim 1, wherein the isolation trench is formed by self-aligned etching the substrate using the sidewall spacers in the coarse space.

5. The method of claim 4, wherein the isolation trench is formed with a smaller width comparing to widths of the end-to-end space and the coarse space, respectively.

6. The method of claim 1, further comprising:
   filling in the isolation trench with an isolation dielectric layer; and
   recessing the isolation dielectric layer to form an isolation feature in the isolation trench.

7. The method of claim 6, further comprising:
   after filling in the isolation trench with the isolation dielectric layer, removing the spacer layer between the adjacent fins.

8. The method of claim 1, further comprising:
   before forming the mandrel features, depositing a hard mask over the substrate; and
   during etching the substrate to form the fins, etching the hard mask such that portions of the hard mask become top layers of the fin.

9. The method of claim 8, wherein the hard mask protects the fins during forming the isolation trench.

10. The method of claim 9, wherein after forming the isolation trench, removing the hard mask to reveal a top surface of the fin.

11. The method of claim 1, further comprising:
    after etching the substrate to form the fins, removing the mandrel features.

12. A method for fabricating a fin-like field-effect transistor (FinFET) device, the method comprising:
    providing a substrate;
    forming fins over the substrate;
    removing at least one of the fins thereby forming a coarse space among the remaining fins;
    depositing a spacer layer to fill in a space between the adjacent fins and cover sidewalls of the fins;
    forming sidewall spacers on the fins;
    removing a portion of one of the fins thereby forming an end-to-end space between remaining portions of the one of the fins, wherein the end-to-end space is space between two ends of the remaining portions of the one of the fins along a length direction of the one of the fins from a plan view;
    forming an isolation trench in the end-to-end space and the coarse space, wherein the fins are protected by the spacer layer and the sidewall spacers; and
    forming an isolation feature in the isolation trench by depositing an isolation dielectric layer.

13. The method of claim 12, wherein the isolation trench is formed by etching the substrate with the sidewall spacers in the coarse space.

14. The method of claim 13, wherein the isolation trench in the coarse space is formed with a smaller width comparing to a width of the coarse space.

15. A method for fabricating a fin-like field-effect transistor (FinFET) device, the method comprising:
    providing a substrate;
    forming a first plurality of fins and a second plurality of fins over the substrate, wherein the first and second pluralities of fins are oriented along a first direction, the first plurality of fins are spaced by a first spacing along a second direction perpendicular to the first direction, the second plurality of fins are spaced by the first spacing along the second direction, the first plurality of fins is spaced from the second plurality of fins by a second spacing along the second direction, and the second spacing is greater than the first spacing;
    forming a spacer layer in the spaces between adjacent fins of the first plurality of fins, in the spaces between adjacent fins of the second plurality of fins, and on sidewalls of the first and second pluralities of fins; and
    removing a portion of the first plurality of fins thereby forming an end-to-end space between remaining portions of the first plurality of fins, wherein the end-to-end space is space between two ends of the remaining portions of the first plurality of fins along the first direction from a plan view.

16. The method of claim 15, wherein the forming of the spacer layer includes:
    depositing a spacer material to fully fill in the spaces between adjacent fins of the first plurality of fins and the spaces between adjacent fins of the second plurality of fins, to partially fill in the second spacing, and on the sidewalls of the first and second pluralities of fins; and etching the spacer material to remove portions thereof in the second spacing to expose the substrate.

17. The method of claim 15, further comprising:

etching the substrate using the first and second pluralities of fins and the spacer layer as an etch mask thereby forming an isolation trench in the substrate.

18. The method of claim 17, further comprising:

depositing an isolation dielectric layer in the isolation trench; and recessing the isolation dielectric layer to form an isolation feature in the isolation trench.

19. The method of claim 18, wherein the recessing of the isolation dielectric layer includes removing the spacer layer.

20. The method of claim 15, wherein the forming of the first plurality of fins and the second plurality of fins comprises:

forming fins that are oriented along the first direction and are spaced by the first spacing along the second direction; and removing the fins in the second spacing.

\* \* \* \* \*